(12) United States Patent
Schemmann et al.

(10) Patent No.: US 8,836,615 B2
(45) Date of Patent: Sep. 16, 2014

(54) DRIVER FOR CONTROLLING A LIGHT EMITTING ELEMENT, IN PARTICULAR AN ORGANIC LIGHT EMITTING DIODE

(75) Inventors: Heinrich Schemmann, Villingen-Schwenningen (DE); Philippe Le Roy, Betton (FR); Gunther Haas, St. Egreve (FR)

(73) Assignee: Thomson Licensing LLC, Princeton, NJ (US)

( * ) Notice: Subject to any disclaimer, the term of this patent is extended or adjusted under 35 U.S.C. 154(b) by 1181 days.

(21) Appl. No.: 12/227,418

(22) PCT Filed: May 11, 2007

(86) PCT No.: PCT/EP2007/054588
§ 371 (c)(1),
(2), (4) Date: Nov. 17, 2008

(87) PCT Pub. No.: WO2007/134991
PCT Pub. Date: Nov. 29, 2007

(65) Prior Publication Data
US 2009/0206764 A1 Aug. 20, 2009

(30) Foreign Application Priority Data
May 18, 2006 (EP) .................................... 06300490

(51) Int. Cl.
G09G 3/30 (2006.01)
G09G 3/32 (2006.01)
H05B 33/08 (2006.01)
H02H 9/00 (2006.01)
G11C 27/02 (2006.01)
G09G 3/20 (2006.01)

(52) U.S. Cl.
CPC ...... *G09G 3/3258* (2013.01); *G09G 2300/0861* (2013.01); *G11C 27/024* (2013.01); *G09G 2300/0852* (2013.01); *G09G 3/2018* (2013.01); *H05B 33/0896* (2013.01); *H02H 9/001* (2013.01)

USPC .......................................................... 345/76

(58) Field of Classification Search
USPC ............ 345/76–83, 102; 315/169.3; 313/463, 313/504
See application file for complete search history.

(56) References Cited

U.S. PATENT DOCUMENTS 6,809,710 B2 * 10/2004 Prache et al. ................... 345/82
7,038,394 B2    5/2006 Yamashita
(Continued)

FOREIGN PATENT DOCUMENTS

DE    202004 014 727    12/2004
JP    2000-353823        12/2000
(Continued)

OTHER PUBLICATIONS

Search Report Dated July 4, 2007.

*Primary Examiner* — Jimmy H Nguyen
(74) *Attorney, Agent, or Firm* — International IP Law Group, PLLC

(57) ABSTRACT

The present invention relates to a circuit for controlling a light emitting element, in particular an organic light emitting diode. The circuit comprises a capacitor connectable with the light emitting element, charging means for charging the capacitor and a switching means. The switching means is adapted to alternately disconnect the capacitor from the light emitting element and connect the capacitor to the light emitting element. The capacitor is alternately charged and discharged. A charging current or a discharge current from the capacitor drives the current of the light emitting element. Said charging means comprises at least one charging transistor for charging the capacitor.

7 Claims, 8 Drawing Sheets

(56) References Cited

U.S. PATENT DOCUMENTS

Figure 1:
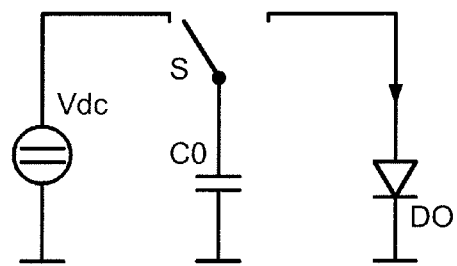

| | | | |
|---|---|---|---|
| 7,285,797 B2 | 10/2007 | Tobita | |
| 2004/0108979 A1 | 6/2004 | Seki | |
| 2004/0263436 A1* | 12/2004 | Okuda | 345/76 |
| 2006/0092148 A1* | 5/2006 | Ozawa et al. | 345/204 |
| 2007/0171180 A1 | 7/2007 | Akiyama | |

FOREIGN PATENT DOCUMENTS

| | | |
|---|---|---|
| JP | 2002-289374 | 10/2002 |
| JP | 2004151194 | 5/2004 |
| JP | 2005130432 | 5/2005 |
| JP | 2005352063 | 12/2005 |
| WO | WO 2005/078810 | 8/2005 |

* cited by examiner

DRIVER FOR CONTROLLING A LIGHT EMITTING ELEMENT, IN PARTICULAR AN ORGANIC LIGHT EMITTING DIODE

This application claims the benefit, under 35 U.S.C. §365 of International Application PCT/EP2007/054588, filed May 11, 2007, which was published in accordance with PCT Article 21(2) on Nov. 29, 2007 in English and which claims the benefit of European patent application No. 06300490.7, filed May 18, 2006.

The invention relates to a driver and method for controlling a light emitting element, in particular an organic light emitting diode OLED. These OLEDS may be used as pixels in micro displays. An organic light-emitting diode (OLED) is a special type of light-emitting diode (LED), in which the emissive layer comprises a thin-film of certain organic compounds. The emissive electroluminescent layer can include a polymeric substance that allows the deposition of suitable organic compounds, for example, in rows and columns on a carrier by using a simple "printing" method to create a matrix of pixels which can emit different colour light.

OLED displays can be used in television screens, computer displays, portable system screens, and in advertising and information and indication applications etc. OLEDs can also be used in light sources for general illumination. OLEDs lend themselves for the implementation of large area light-emitting elements. One of the great benefits of an OLED display over the traditional LCD displays is that OLEDs do not require a backlight to function. This means that they draw far less power and, when powered from a battery, can operate longer on the same charge.

Micro displays can be based on a substrate of mono-crystalline silicon, on which the electronic circuits required for driving are disposed. Layers of OLED material are deposited on one surface of the substrate.

Micro displays face several technical problems, amongst which are:
  limited space for circuit elements in the available cell area;
  high voltage operation (3 . . . 5V);
  very small OLED diode current, e.g. <1 nA, needing e.g. sub threshold operation of transistors and incurring sensitivity to leakage currents;
  I/U characteristic of OLED influencing the current and thus the picture homogeneity; and
  difficulties in the required dynamic for programming of pixels due to small currents.

It is an object of the present invention to provide an improved driver for controlling a light emitting element (DO), which overcomes the drawbacks of the state of the art.

The object is solved by a driver for controlling a light emitting element, in particular an organic light emitting diode according to the appended claims. The driver comprises a capacitor connectable with the light emitting element, charging means for charging the capacitor and a switching means. The switching means is adapted to alternately disconnect the capacitor from the light emitting element and connect the capacitor to the light emitting element. The capacitor is alternately charged and discharged. A charging current or a discharge current from the capacitor drives the current of the light emitting element. Said charging means comprises at least one charging transistor for charging the capacitor.

The circuits according to the invention described in the following present a new circuit for generating the OLED diode current. The current is set by charging and discharging a capacitor at a given clock frequency.

Figure 15:
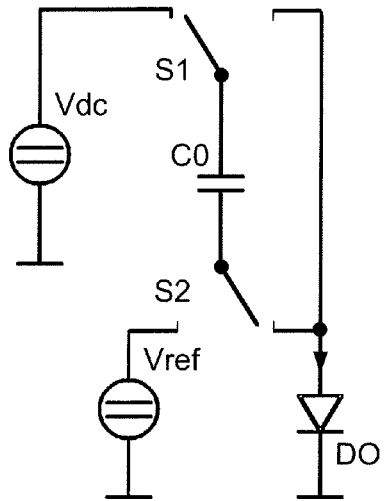
Figure 2:
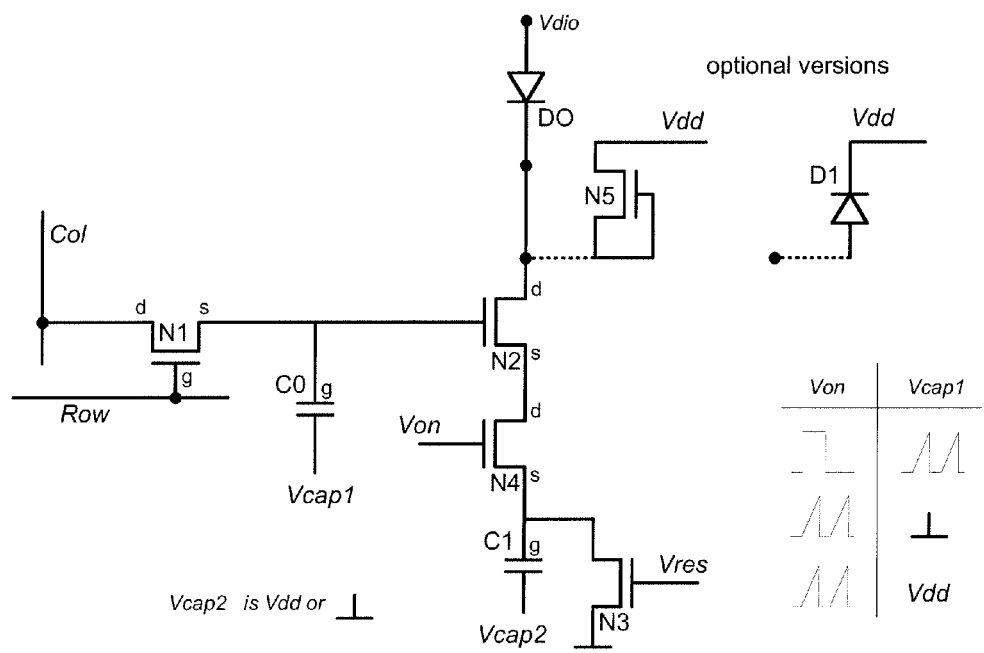
Figure 3:
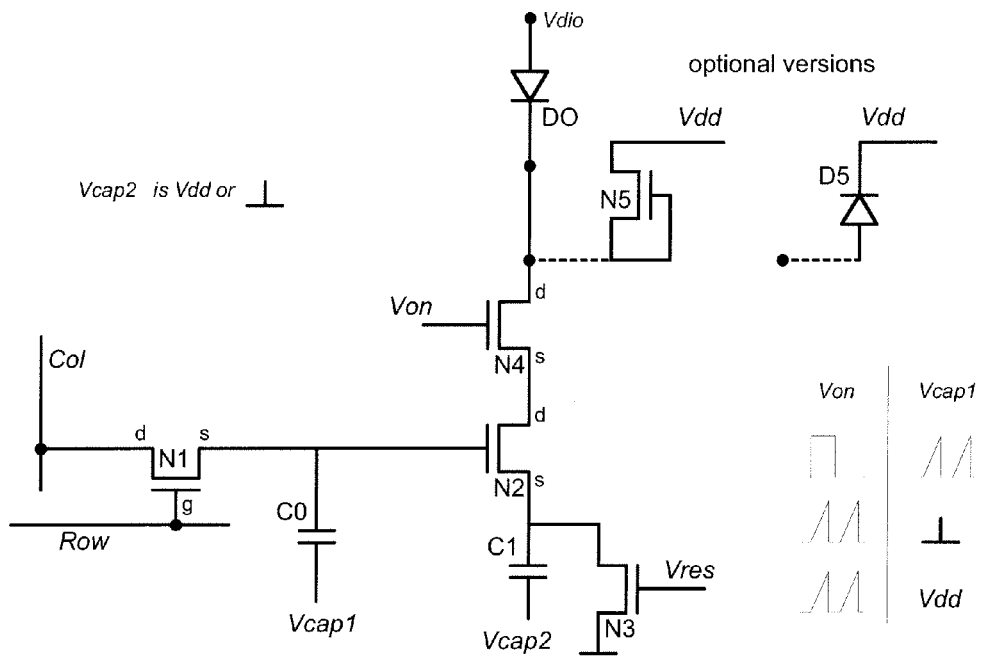
Figure 4:
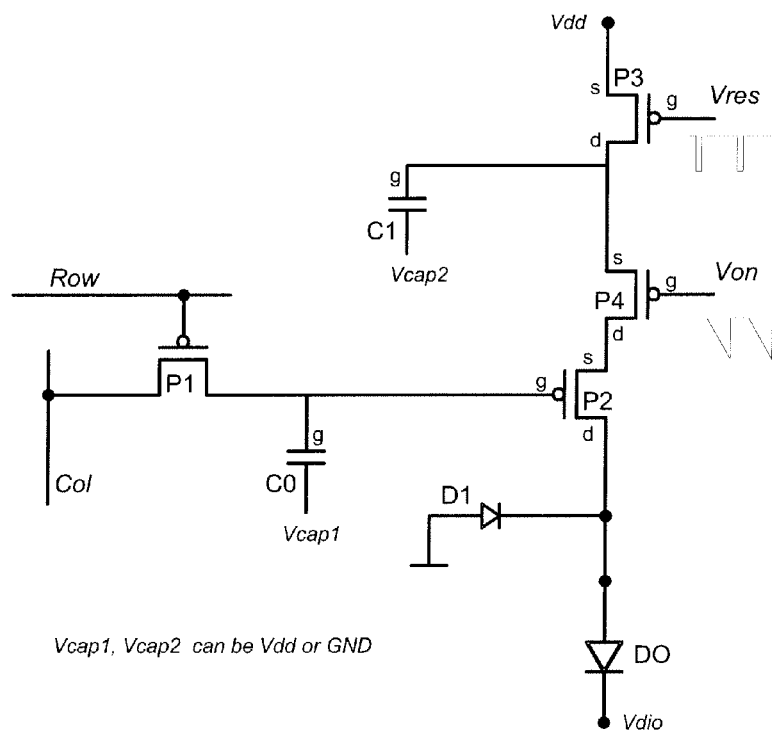
Figure 5:
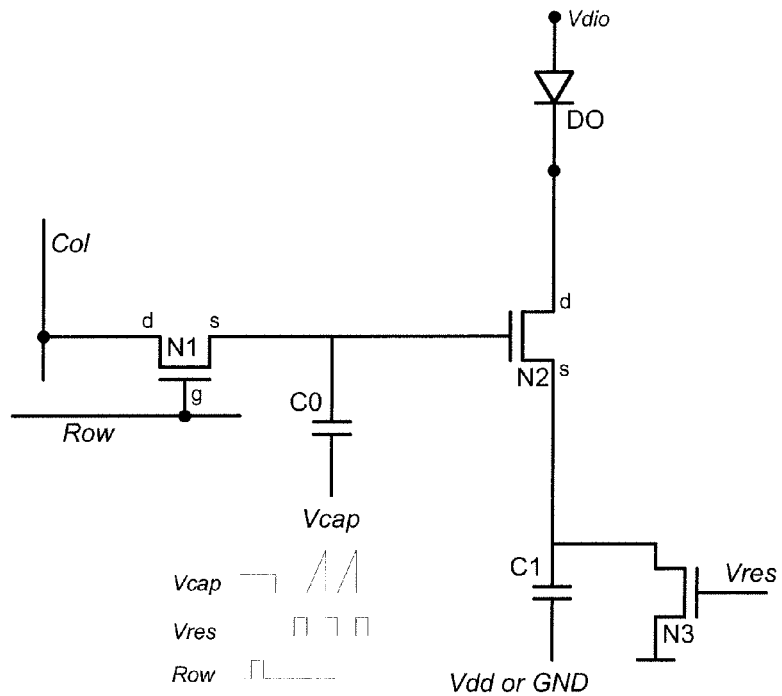
Figure 6:
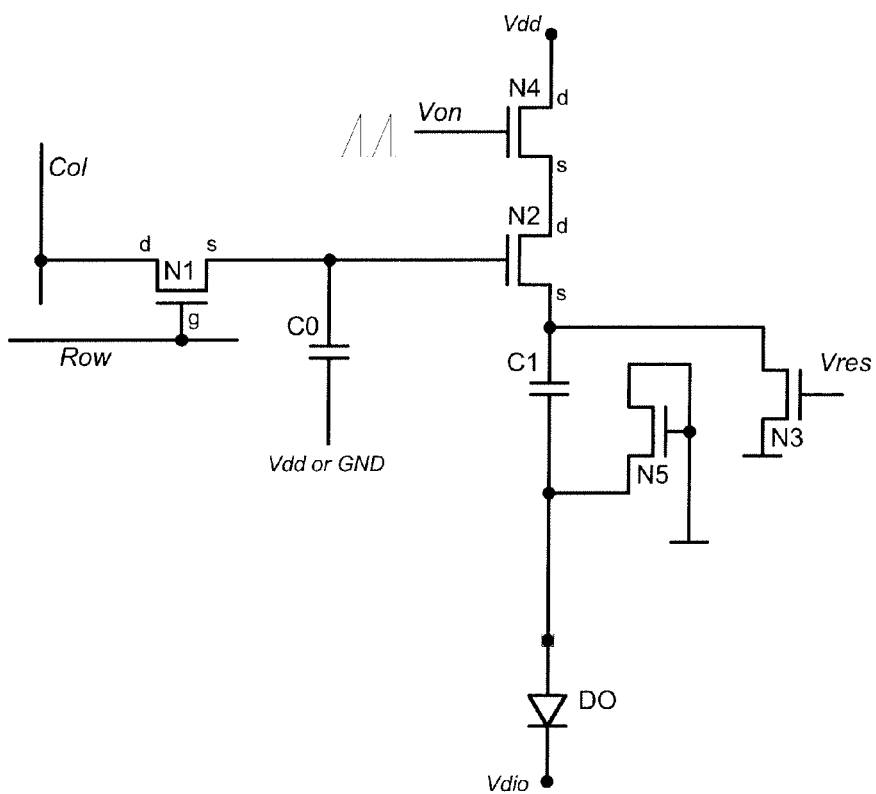
Figure 7:
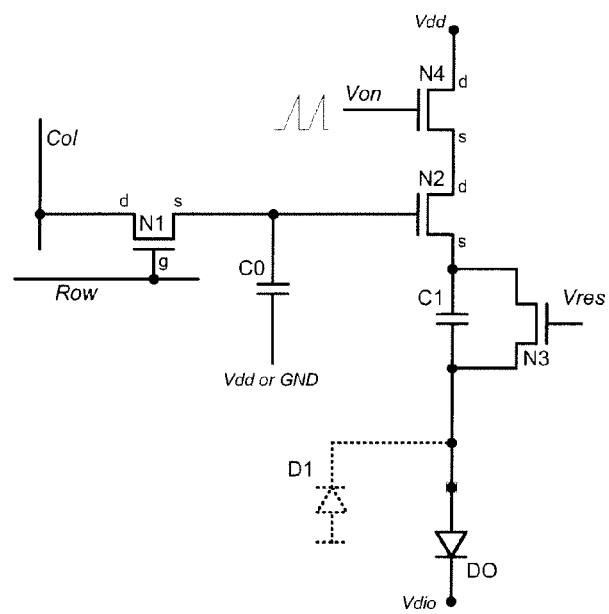
Figure 8:
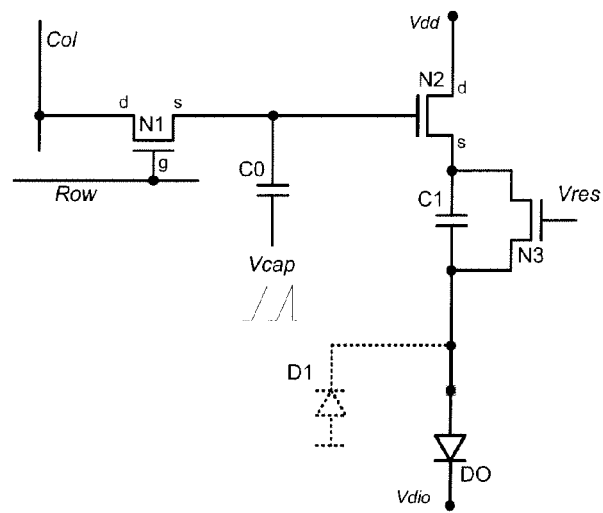
Figure 9:
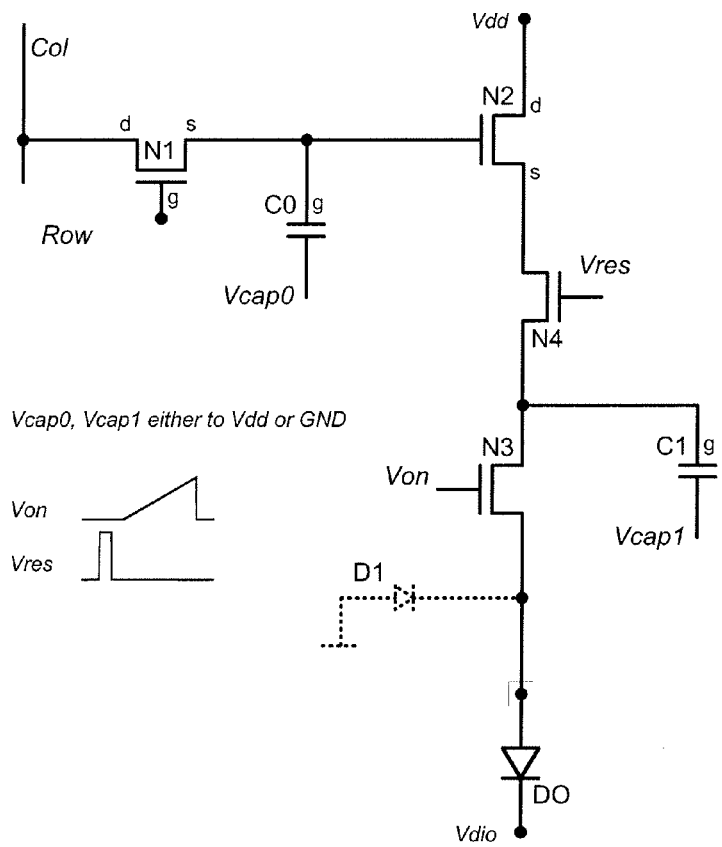
Figure 10:
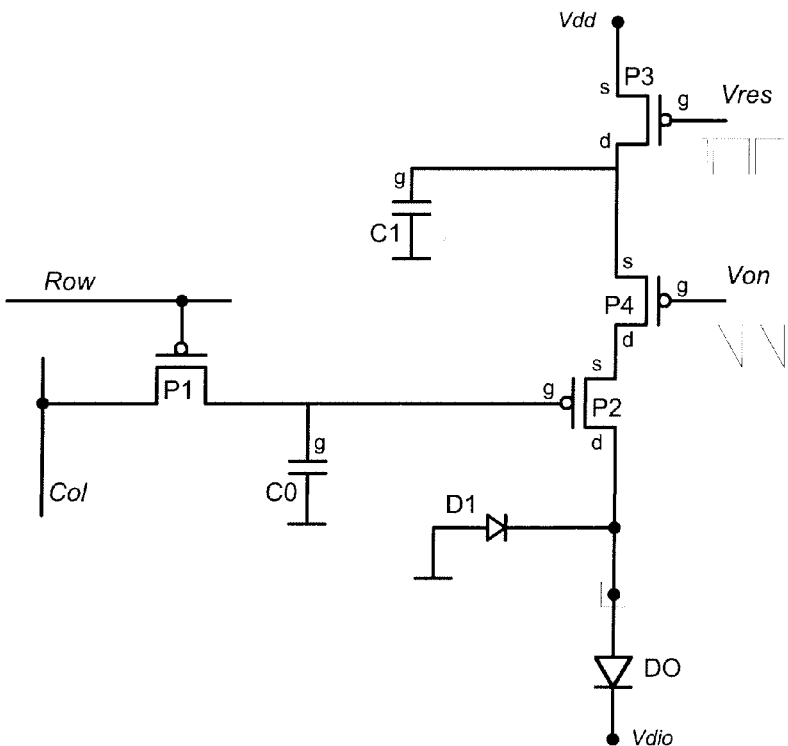
Figure 11:
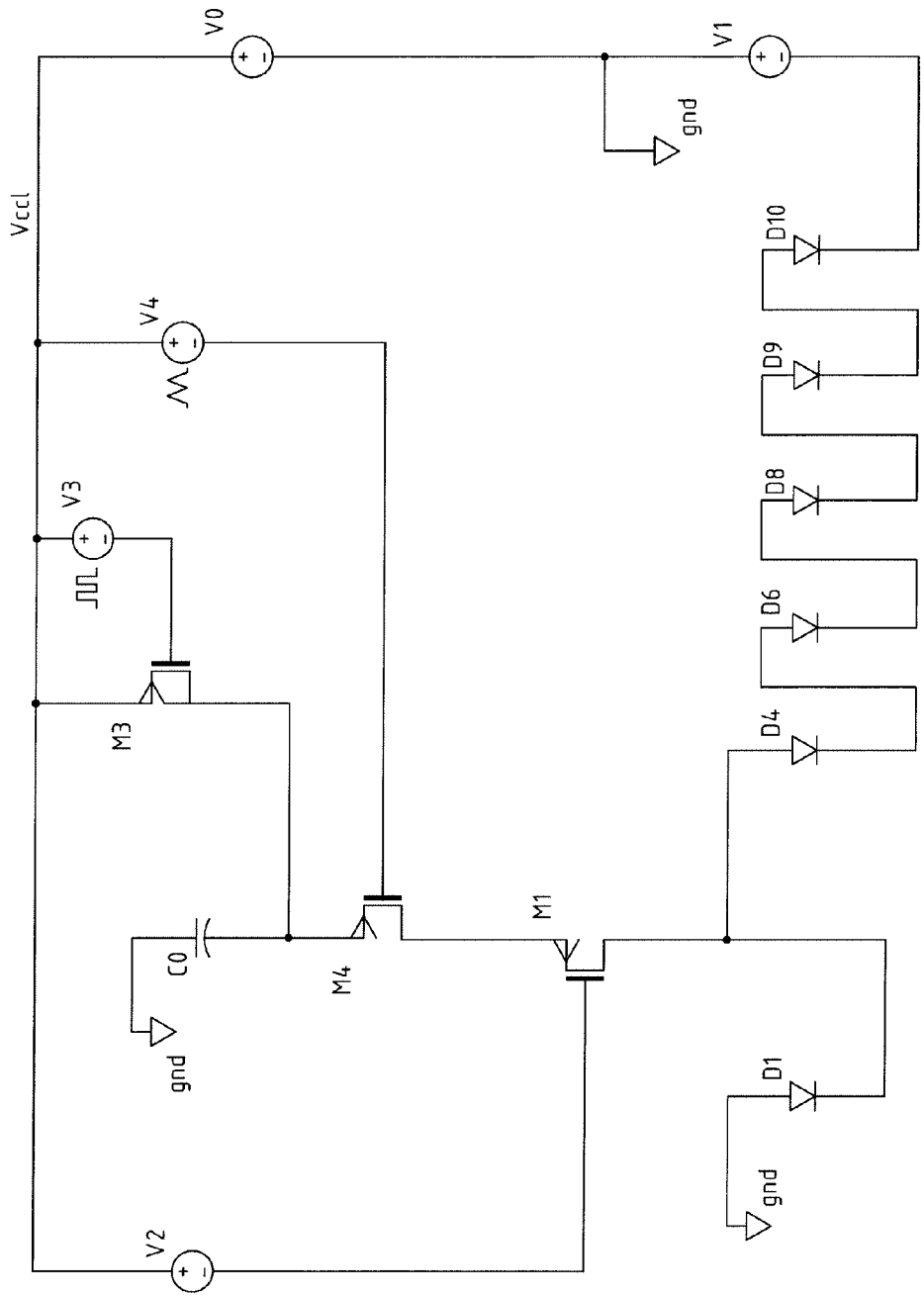
Figure 12:
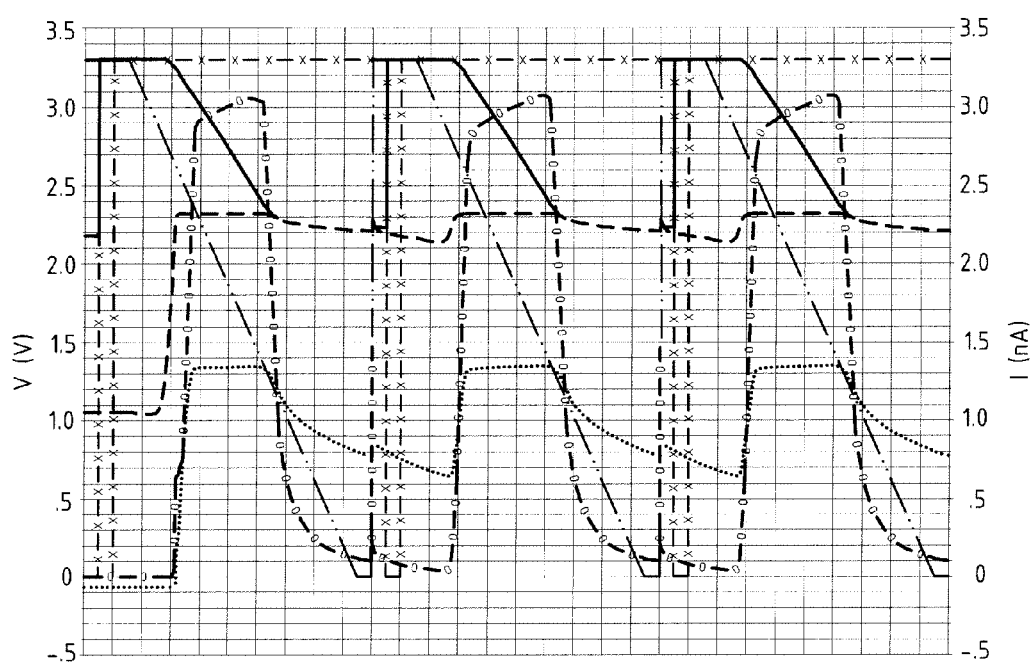
Figure 13:
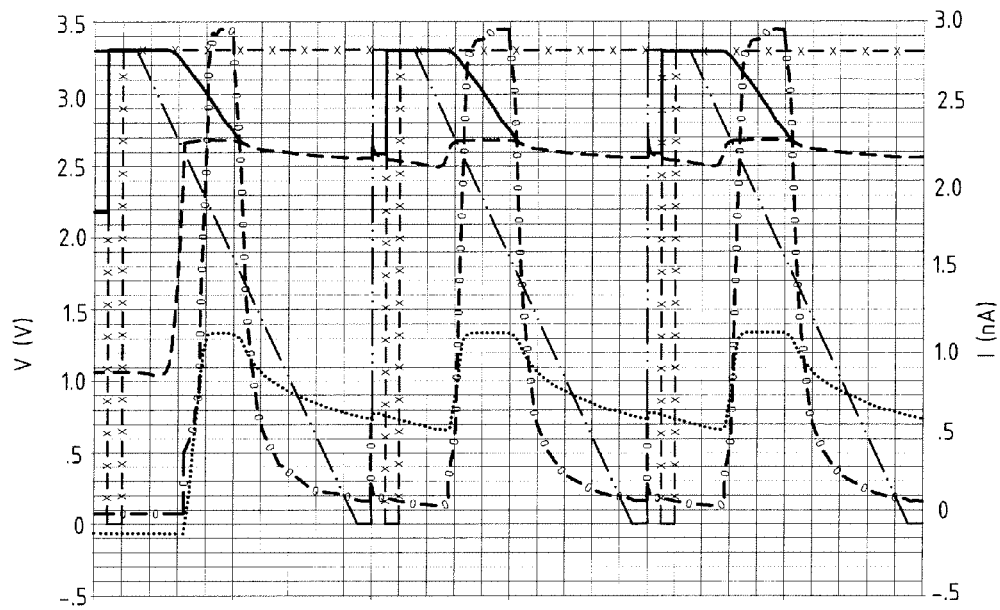
Figure 14:
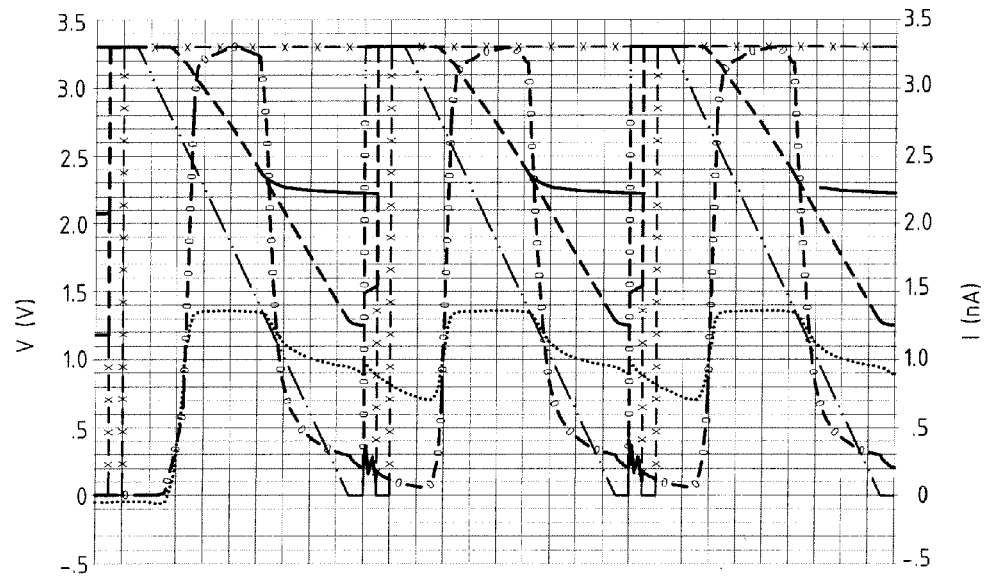

Preferred embodiments of the present invention are described hereinafter with reference to the drawings, in which
  FIG. 1 depicts the basic principle of the present invention;
  FIG. 2 shows a first embodiment of the present invention;
  FIG. 3 shows a second embodiment of the present invention;
  FIG. 4 shows a third embodiment of the present invention;
  FIG. 5 shows a fourth embodiment of the present invention;
  FIG. 6 shows a fifths embodiment of the present invention;
  FIG. 7 shows a sixth embodiment of the present invention;
  FIG. 8 shows a seventh embodiment of the present invention;
  FIG. 9 shows an eighth embodiment of the present invention;
  FIG. 10 shows a ninth embodiment of the present invention;
  FIG. 11 shows a circuit used for simulating voltages and currents;
  FIG. 12 shows waveforms of a first simulation of an embodiment of the invention;
  FIG. 13 shows waveforms of a second simulation of an embodiment of the invention;
  FIG. 14 shows waveforms of a third simulation of an embodiment of the invention; and
  FIG. 15 shows a diagrammatic representation of a further development of a circuit according to the invention.

The basic principle of the present invention is illustrated in FIG. 1. FIG. 1 shows a driver for controlling an organic light emitting diode DO. The circuit consists of a voltage source Vdc, a capacitor C0, a switch S and the organic light emitting diode DO. The diode DO has an anode and a cathode. The cathode is connected to ground potential. The anode of the diode DO is connectable to one electrode of the capacitor C0 via the switch S. The opposite electrode of the capacitor is connected to ground potential. Furthermore, the voltage source Vdc may also be connected via the switch S to the capacitor. The voltage source is referenced to ground potential. Ground potential is only chosen for convenience. Any predetermined reference potential may be chosen instead. The switch S either connects the voltage Source Vdc with the capacitor or the diode DO with the capacitor. The voltage source and the diode are never simultaneously connected to the capacitor. C0.

The circuit of FIG. 1 is operated by alternately connecting the voltage source Vdc and the diode DO to the capacitor. The voltage source charges the capacitor C0 to its output voltage as long as it is connected to the capacitor. When the capacitor is connected to the diode DO, the capacitor is discharged via the diode DO. A current flows through the diode, which depends on the potential difference between the capacitor voltage and ground potential. The luminance of the diode may be controlled by applying a desired charge to the capacitor C0, resulting in a corresponding voltage, which in turn produces a current through the diode determining the luminance.

The basic principle is shown in FIG. 1. The diode current (idealized) is given by:

$$I_{DO} = C0 * V_{dc} * f_s$$

wherein $f_s$ is the switching frequency of the switch S, C0 is the capacity of the capacitor C0 and $V_{dc}$ is the voltage of the voltage source $V_{dc}$. The current $I_{DO}$ is proportional to the charge voltage, or, put more correctly: The current is proportional to the voltage difference between the charged and the discharged state of the capacitor. Good picture uniformity can be achieved, since frequency control and stability, capacitor matching and also a good voltage precision can be achieved within narrow tolerances.

The above-mentioned principle may be applied to circuits for active matrix OLED displays, which allow better display performance and life time of the OLEDs due to the inherent smaller currents in operation when compared to passive matrix OLED displays. An active matrix OLED display (AMOLED) is a type of display, which uses transistors for switching individual light emitting elements of a display.

The active matrix display may contain, besides the light emitting elements, a matrix of thin-film transistors (TFTs). These devices store the electrical state of an individual pixel on the display while all the other pixels are being updated. This method provides a much brighter, sharper display than a passive matrix of the same size.

Thin film transistors may be used for constructing an active matrix. However, a thin film transistor is just one component in an active matrix and some designs have used other active components such as diodes. A passive matrix display uses a simple conductive grid to deliver current to the light emitting element in the target area, whereas an active matrix display uses a grid of transistors and capacitors, which may be integrated together with the thin film transistors, with the ability to hold a charge for a limited period of time. Because of the switching action of transistors, only capacitor associated with the desired pixel receives a charge, and the capacitor holds the charge until the next refresh cycle, improving image quality over a passive matrix.

Integrated MOS capacitors typically have a capacitance per area in a range of 5 fF per micron square. For an exemplary 5×5 μm pixel 20 fF for the charge capacitor can be assumed, when an area of 2×2 μm is used for the capacitor. Operating the switch S at 32 kHz and assuming a voltage for Full Scale (FS) of 2V, the average diode current will have a FS value of $$I_{DO,max}=1.28 \text{ nA}$$

For avoiding high peak currents when switches are closing a ramp-like control voltage may be used. That is, the output voltage of the voltage source $V_{dc}$ may be controlled to continually increase, while the voltage source is connected to the switch. The peak current occurs, when the voltage difference between the voltage source and the capacitor is greatest. This is the case, when the voltage source is connected to the capacitor C0. The ramp-like output voltage reduces the peak current in comparison with an output voltage, which is applied in a step-like manner.

A detailed analysis shows the impact of Vth mismatches, i.e. variations between threshold voltages Vth of individual MOS transistors. A first rough analysis has shown that on mono crystalline silicon, and assuming FS (Full Scale) voltage amplitudes of 2V, the Vth mismatch is essentially negligible. Anyhow, some mismatch compensation is included in some of the following circuits.

FIG. 2 shows an exemplary circuit using n-channel FETs (field effect transistors). In FIG. 2, corresponding elements are designated by the same reference signs.

The circuit shown in FIG. 2 represents a single element in an active matrix display. Each light emitting element in the display may be addressed using a column and row line. A column line is connected to each light emitting element in a column of the matrix; a row line is connected to each light emitting element in a row of the matrix. The column line and row line are designated by reference signs Col und Row in FIG. 2.

FIG. 2 comprises a light emitting diode DO, which has an anode connected to a constant reference voltage Vdio. In this respect, the circuit of FIG. 2 differs from the circuit of FIG. 1, in which the current to the anode of the diode DO was controlled. The cathode of the light emitting diode DO is connected via field effect transistor N2 and N4 to a capacitor C1. Source s of transistor N2 is connected to the drain of transistor N4. The drain current of transistor N2 corresponds to the current flowing through the light emitting diode DO. Furthermore, the drain current of N2 roughly corresponds to the source current s of transistor N4. The luminosity of diode DO is controlled by charging and discharging capacitor C1 connected to the source of transistor N4.

The amount of current flowing through diode DO depends on the voltage difference between the voltage applied to the gate of transistor N2 and the voltage drop over the drain d and source s of transistor N2. The current is controlled by the gate voltage g of the transistor, which in turn is controlled by the column and row signals. A transistor N1 is connected to both to the column and row line as well as the gate of transistor N2. The gate of transistor N1 is connected to the row line. If the row line carries a high voltage signal, then the drain-source channel of the transistor N1 is made conductive. The voltage signal on the column line connected to the drain of transistor N1 is transferred to the source of transistor N1 as well as the gate of transistor N2. In this instance, the transistor N2 is operated in the saturation region. During the programming phase, the node g is set to the programming voltage. This is done by applying the programming voltage to the column line Col and applying a high pulse to the row line Row. The programming is usually done synchronously, line by line, with the incoming video signal.

The voltage at the source s of transistor N2 is equal to the voltage on C0 minus the gate source voltage drop. The capacitor C1 is repeatedly charged to roughly the voltage on C0 by making N4 conductive for a time. The source follower transistor N2 and the voltage on C0 determine when the charging is completed. The current flowing through transistors N2 and N4 is also the current through the light emitting diode DO.

After having charged the capacitor C1, the capacitor is disconnected from the source of transistor N2 using a low voltage on the gate of transistor N4. During this time, C1 is discharged. This is achieved by connecting the source of transistor N4 to ground. Therefore, a transistor N3 operated in parallel with the capacitor C1 receives a high voltage Vres at its gate. The process of charging capacitor C1 resumes by applying a low voltage Vres to the gate of transistor N3 and applying a high voltage Von to the gate of transistor N4.

In FIG. 2, a table shows exemplary voltage signals for Von and Vcap1. Each entry in the table represents the amplitude of voltage signals Von and Vcap1 versus time. Vcap is a voltage applied to the electrode of capacitor C0 opposite to the electrode connected to the gate of transistor N2.

Controlling Vcap1 can help also to shift the possible voltages on the column Col to a suitable range during the programming period, and afterwards to a different level for best charge pump operation. In particular, while the gate of transistor N1 receives a low signal, the voltage of capacitor C0 can be adjusted using the voltage Vcap1. The voltage Von represents the voltage applied to the gate of transistor N4. A high voltage Von increases the current flowing to capacitor C1. In the first line of the table, a period of the voltage Von follows a square wave function, whereas the voltage Vcap1 has a saw tooth shape. The saw tooth voltage gradually increases the voltage on the gate of transistor N2 as well as the current flowing to the capacitor C1, while the gate of transistor N4 receives a high signal. Thereby, peak currents flowing to the capacitor and light emitting diode can be reduced. Consequently, the current and luminance of light emitting diode DO is essentially constant as the capacitor C1 is being loaded.

In the second row of the table of FIG. 2, the voltage Von has a saw tooth form, whereas the voltage Vcap1 is connected to ground potential. In this case, transistor N4 is used for reducing the peak current flowing to the capacitor C1. A high peak current would flow, if a high voltage were immediately applied to the gate of transistor N4. In this instance, the voltage difference between the drain and source of transistor is greatest, leading to a peak current. Since the capacitor C1 is gradually charged, the voltage difference between the source and drain of the transistor is gradually reduced. The peak current is reduced and generally the current into capacitor C1 is controlled by gradually increasing the gate voltage Von of transistor N4. In this case transistor N4 is operated as a controllable resistor, whereby the voltage drop across the drain and source of transistor N2 may be controlled in a suitable manner.

The circuit of FIG. 2 may additionally comprise a transistor N5 or a diode D1. In the figure transistor N5 acts as a diode, since the drain of transistor N5 is connected to the gate of transistor N5. The anode of diode N1 and the transistor N5 acting as a diode is connected to the cathode of the light emitting diode DO. The cathode of diode D1 is driven with a supply voltage Vdd. The additional diode may serve different purposes, in particular:

In the case of a high voltage operation and a low voltage CMOS process: If the voltage Vdio exceeds the maximum permitted IC supply voltage Vdd, the diode, e.g. N5, limits the voltage present at the drain electrode of transistor N2.

In order to provide a certain degree of testability, the diode N5 or D1 can be used to form a current path during steps of manufacturing, e.g. in case the OLED device is not yet deposited on top of the transistor array or matrix. Manufacturing tests of raw wafers with reasonable test coverage are thus possible. In this case supply voltage Vdd could for example be applied to separate column or row lines.

In order to provide a certain degree of Vth compensation it is, for example, possible to provide a time period during which the OLED is intentionally shortened by the diode. This can be achieved by pulling down Vdio. Then, the voltage Vcap1 and consequently the voltage of the gate of transistor N2 are ramped up slightly, so that transistor N2 starts to conduct. In this instance, the field effect transistor N2 is operated on the verge between the saturation region and the ohmic region. Capacitor C1 and equally the source of transistor N2 reaches a voltage, which is lower by Vth of N2 than the gate voltage of transistor N2. Vth is the threshold voltage of transistor N, which may vary due to production tolerances. The resulting current is independent of the threshold voltage Vth of transistor N2 and its tolerance.

Voltages Vcap 2, and also Vcap1 can be connected to either supply voltage Vdd or ground voltage GND. Connecting to ground voltage GND is preferable in order to avoid detrimental effects caused by additional AC current components on the supply rails. However, for capacitor implementation reasons, the supply voltage Vdd can also be used.

FIG. 3 shows a second embodiment of the present invention. The embodiment of FIG. 3 largely corresponds to the embodiment of FIG. 2. Identical components are designated with the same reference numerals in FIGS. 2 and 3. The only difference between FIG. 2 and FIG. 3 is the placement of transistor N4 relative to the light emitting diode DO, transistor N2 and the capacitor C1. In the third embodiment of FIG. 3, the transistor N4 is arranged between the diode DO and the transistor N2. The position of transistors N2 and N4 have been exchanged. The overall function of the circuit is the same. Either of the circuits presented in FIG. 2 or FIG. 3 can be preferable for layout reasons. The optional addition of transistor N5 and D5 is identical to FIG. 2. Furthermore, the proposed operation of transistor N4 and capacitor Vcap1 using the signals represented in the accompanied table of FIG. 3 is identical with FIG. 2.

FIG. 4 shows a similar topology as FIG. 2. N-channel transistors N1, N2, N3 and N4 of FIG. 2 correspond to p-channel transistors P1, P2, P3 and P4 of FIG. 4, respectively. Unlike the embodiment of FIG. 2, the signals input to the gates of each transistor P1 to P4 are inverted. This is done, because a p-channel transistor must be operated with a negative gate voltage with respect to its source electrode, whereas an n-channel transistor requires a positive gate voltage. Furthermore, the anode instead of the cathode of the light emitting diode DO is connected to transistors P2, P4 and capacitor C1 in the series connection. The direction of the source-drain current of the p-channel transistors is reversed in relation to the current direction of the corresponding n-channel transistors. Therefore, the anode of light emitting diode instead of the cathode is chosen in the embodiment of FIG. 4. Capacitors C0 and C1 have their reference terminals connected to Vdd or GND. Swapping the order of P2 and P4 is also an option here, similar as described under FIG. 3.

Using p-channel-MOS devices may be preferred because many common OLED displays use a common top electrode, which is the cathode (Vdio). As for the n-channel circuit of FIGS. 2 and 3, P4 and P2 may be swapped in order. FIG. 4 additionally shows exemplary voltage signals Vres and Von over time, which drive the transistor P3 and P4, respectively. Transistor P3 is driven by a square wave signal. The effect of this signal is to connect capacitor C1 with the supply voltage Vdd in order to discharge capacitor C1. Alternatively, the source of transistor P3 may also be connected to ground potential GND. The square wave pulses periodically discharge capacitor C1. Intermittently, the capacitor C1 is charged by applying a saw tooth shaped voltage Von applied to the gate of capacitor P4. The saw tooth shape brings about a relatively constant current, which drives the light emitting diode DO and charges the capacitor C1, as explained further above.

FIG. 5 shows a representation of the circuit for controlling a light emitting element DO according to a fourth embodiment of the present invention. The circuit of FIG. 5 uses n-channel transistors for driving the diode. The arrangement of the circuit of FIG. 5 largely corresponds to the circuit according to FIG. 2. Unlike FIG. 2, the transistor N4 has been omitted in FIG. 5. Otherwise, the arrangement of transistors and capacitors is identical in FIG. 2 and FIG. 5. The operation of the circuit of FIG. 5 differs from the operation of the circuit of FIG. 2, since the switching transistor N4 is missing in FIG. 5. FIG. 5 further comprises a representation of the voltage signals Vcap, Vres and Row over time, which are applied to the capacitor C0, the gate of transistor Vres and the row line, respectively. The amplitude of each voltage is shown to change with time. Initially, the voltage on the column line is applied to the gate of transistor N2 by a rectangular pulse row voltage signal. Thereafter, the voltage Vcap is reduced in a step-like fashion. Consequently, transistor N2 is operated in the cut-off region. In the next step, the capacitor C1 is connected to ground by applying a square wave voltage signal Vres to the gate of transistor N3. When connecting capacitor C1 to ground using transistor N3, the voltage Vcap must be driven low to prevent transistor N2 from becoming conductive. Then the n-channel transistor N3 is opened, i.e. does not conduct, and the gate voltage of transistor N2 is gradually increased using a ramp voltage signal Vcap at the capacitor C0. Consequently, a substantially constant current flow through the light emitting diode DO is established for a certain period in time, i.e. throughout the drive period.

FIG. 6 shows a fifth embodiment of the driver according to the present invention. The circuit of FIG. 6 is composed of n-channel transistors N1 to N5, capacitors C0 and C1 as well as light emitting diode DO. The arrangement of capacitor C0 and transistor N1 in FIG. 6 corresponds to the arrangement of FIG. 5. Unlike FIG. 5, the capacitor C1 is directly connected to the anode of the light emitting diode DO. Transistor N2 is connected with its source to capacitor C1 in a series connection. The base of transistor N2 is driven by the column line when transistor N1 is operated in the saturation region by applying a high voltage to the base transistor N1. Transistor N3 is connected to capacitor C1 in order to discharge the capacitor. The drain of transistor N3 is connected to ground potential.

In the present circuit transistors N5 and N4 have been added to the circuit of FIG. 5. Transistor N5 is operated as diode by connecting the source and base of transistor N5 to ground potential. The drain of transistor N5 is also connected to the anode of light emitting diode DO. Therefore, the transistor basically prevents that the potential of the anode of the light emitting diode DO drops far below ground potential. When transistor N3 connects the capacitor with ground potential for resetting the potential of the anode of the light emitting diode is pulled up by the charge current through the diode, which is formed by transistor N5 in this figure. This reset creates a dependency on the threshold voltage Vth of transistor N5, since the drain voltage of N5, which corresponds to the anode voltage of DO, should be approximately equal to ground potential minus the threshold voltage Vth. The cathode of the light emitting diode DO is connected to the diode voltage Vdio. The cathode voltage Vdio should be chosen in such a way that no current flows through the diode DO once the capacitor C1 has been discharged.

This circuit has the advantage that it presents a true n-channel based solution. However, in this circuit the gates of n-MOS are on high voltages, not only the drain nodes. Further, the light emitting diode DO is in the source path of the transistor N2, so its electrical characteristics, e.g. the U/I-characteristic or the forward voltage of the light emitting diode DO, have an influence. Further, the capacitor C1 has no node on a supply level Vdd.

The latter point requires that the voltage one the column line Col must be higher than the voltage drop across the anode and cathode of the light emitting diode DO. In one exemplary embodiment the cathode voltage Vdio is chosen to be a negative voltage in relation to ground voltage. The light emitting diode DO may just not conduct, when the anode is on substrate ground level.

FIG. 7 shows a depiction of the sixth embodiment of the present invention. The circuit of FIG. 7 largely corresponds to the circuit of FIG. 6. Unlike FIG. 6, transistor N3 connects the source of transistor N2 with the anode of the light emitting diode DO. Therefore, the capacitor is discharged by short circuiting both sides of the capacitor C1. Instead of transistor N5, a Diode D1 is connected to the anode of the light emitting diode DO. The diode D1 performs the same function as the transistor N5 in FIG. 6, which is operated as diode. Diode D1 may be a part of transistor N3 and is then formed by connecting an active $n^+$-region to the p-doted substrate of the transistor. Capacitor is charged using transistors N2 and N4. The gate voltage of transistor N4 is ramp-shaped in order to supply a substantially constant current during driving. The capacitor, which is being charged, drives the current through the light emitting diode DO.

FIG. 8 illustrates the seventh embodiment of the present invention. The circuit of FIG. 8 corresponds essentially to the circuit of FIG. 7. Unlike FIG. 7, the circuit of FIG. 8 does not comprise switching transistor N4. Instead the drain of transistor N2 is connected to the supply voltage Vdd. Otherwise the two embodiments seven and eight are identical. In the embodiment of FIG. 8 care must be taken during reset of capacitor C1 in order to avoid any current flow through transistor N2. Therefore, the voltage Vcap applied to the capacitor C0 must be chosen appropriately. Vcap must be pulled down in order to reduce the potential at the gate of transistor N2. Consequently, the transistor is operated in the cut-off region, while the capacitor C1 is being discharged. In this circuit one charge pulse during programming may be required.

FIG. 9 shows a circuit for controlling a light emitting diode according to the eighth embodiment of the present invention: A pixel circuit based on n-MOS devices and with an OLED of common cathode type. Transistors N2 and N4 may be swapped in order, similar to embodiments described further above. The arrangement of transistors N, N2, capacitor C0 and column and row lines Col and Row are identical with the arrangement of the embodiment of FIG. 8. In the eighth embodiment, the anode of the light emitting diode DO is connected to a cathode of a diode D1 and a source of transistor N3. A charging capacitor is connected to the drain of transistor N3, which is driven by a gate voltage Von. Unlike the embodiment of FIG. 8, the capacitor C1 is not directly connected to the anode of the light emitting diode DO.

Capacitor C1 is discharged by gradually increasing the gate voltage Von of transistor N3; the voltage signal Von versus time is graphically represented in FIG. 9. Both the capacitor C1 and the drain of transistor N3 are connected to the source of transistor N4, which is driven by a gate voltage Vres. While the capacitor C1 is being discharged by ramping the gate voltage Von, the gate voltage Vres of transistor N4 is in a low state; i.e. transistor N4 is operated in the cut-off region. Therefore, the source current of transistor N4 is zero and the whole discharge current of capacitor C1 flows through the light emitting diode DO; the discharge current does not flow through diode D1, since diode D1 is connected with its cathode to transistor N3.

The charging of capacitor C1 is accomplished by operating transistor N3 in the cut-off region, such that a current from transistor N4 flows completely to circuit node g of capacitor C1. A rectangular pulse voltage signal Vres is applied to the gate of transistor N4, while the gate voltage Von of transistor N3 is low. The magnitude of the charging current depends both on the gate voltage of transistor N2 and the supply voltage Vdd supplied to the drain of transistor N2. The gate voltage is not ramped, since it is not necessary to provide a constant current for charging the capacitor C1. Transistor Vres is simply operated as a switch in order to charge the capacitor C1. The gate voltage of transistor N2 is essentially equal to the voltage on column line Col, when transistor is operated in the saturation region using an appropriate row line voltage.

Capacitor C0 is connected with one electrode to the gate of transistor N2 and with the opposite electrode to voltage Vcap0. Capacitor C0 stores the voltage from the column line Col. Vcap0 may be chosen to be equal to the supply voltage Vdd or ground potential GND. One electrode of capacitor C1 is connected to the source of transistor N4 as well as the drain of transistor N3; the other electrode of capacitor C1 is connected to a voltage Vcap1, which may be chosen to be equal to the supply voltage Vdd or ground potential. When Vcap0 and Vcap1 are connected to supply voltage Vdd the capacitors C0 and C1 may be advantageously implemented as p-MOS capacitors. Diode D1 may be formed by the intrinsic diode of transistor N3. This embodiment advantageously has no floating capacitor.

FIG. 10 shows the circuit according to the ninth embodiment of the present invention. The circuit of FIG. 10 corresponds to the circuit of FIG. 4 save for two exceptions. Firstly, in FIG. 4 capacitor C0 is connected to potential Vcap1, whereas capacitor C0 in FIG. 10 is connected to ground. Secondly, capacitor C1 in FIG. 4 is connected to the voltage Vcap2, whereas the corresponding capacitor C1 in FIG. 10 is also connected to ground. The diode current of the light emitting diode DO of FIG. 10 is controlled by charging and discharging capacitor C1.

FIG. 11 shows an exemplary circuit according to the invention used for simulating voltages and currents of the charge pump. The simulation circuit essentially corresponds to the circuit of FIG. 10. When compared to the circuits described above, the programming transistor P1 and the storage capacitor C0 were replaced by a DC voltage source V2, since the main interest of the simulation was the analysis of the charge pump function. The OLED DO has been replaced by a series connection of 5 silicon diodes D4, D6, D8, D9 and D10 for taking the higher forward voltage of OLEDs cf. silicon diodes into account. Diode D1 avoids over-voltage breakdown at the drain of the drive transistor M1, which corresponds to transistor P2 in FIG. 10, when no current is flowing. In an exemplary simulation capacitor C0, corresponding to capacitor C1 in FIG. 10, may for example be charged and discharged at a frequency of 100 kHz. The cathode of the light emitting diode DO is connected to the voltage Vdio, which may be equal to −2V. Vdio of FIG. 10 is represented by voltage source V1 in FIG. 11. The supply voltage Vdd, represented by voltage source V0 in FIG. 11, is preferably equal to 3.3V. The reset voltage Vres is a square shape pulsed signal, which is applied to the base of transistor M3, which corresponds to transistor P3 in FIG. 10. The capacitance of the charging capacitor C1 may be chosen to be equal to 10 fF. The pump capacitor C0 (C1 in FIG. 10) is charged to approximately 2V−Vth, corresponding to the maximum brightness case.

FIG. 12 shows simulated results for the circuit of FIG. 11. The waveforms in FIG. 12 show in the upper part voltages, including the control voltages applied to the circuit. The bottom line represents the current into the OLED. It can be seen that in the centre part of each 10 us period, the current is essentially constant at 3 nA. Average current is around 1 nA. This can be seen best in the second and third period, since some voltage initialization is visible the first period.

FIG. 13 shows simulated waveforms with the pump capacitor C1 charged to 1.5V−Vth. A comparison with the waveforms in FIG. 11 clearly shows a lower average current. The reason is mainly a shortened time of current flow.

FIG. 14 shows simulated waveforms for a circuit in which the transistors corresponding to P2 and P4 in FIG. 11 are swapped. No major difference is visible.

FIG. 15 shows a diagrammatic representation of a further development of a circuit according to the invention. In the further embodiment, capacitor C0 is coupled to the light emitting means DO during charge and discharge, however with respective opposite electrodes. During charging of the capacitor the charge current causes the light emitting means coupled to one electrode of the capacitor to emit light. The other electrode is of course coupled to a charge voltage source, preferably via a controllable voltage regulator that allows for adjusting a desired voltage waveform. If the charge voltage has an appropriate waveform, e.g. saw-tooth shape as elucidated further above, the charge current and thus the current through the diode is essentially constant. Otherwise a current control means may be provided for controlling the current during charging. Once the capacitor is charged to the desired level, the voltage source used for charging is disconnected from the capacitor. The electrode of the capacitor that has the higher potential is now coupled to the light emitting means DO instead being coupled to the voltage source. The other electrode of the capacitor is coupled to a reference potential lower than the voltage across the capacitor. The reference potential may be ground, or a voltage source essentially corresponding to the forward voltage drop of the light emitting means, allowing for a complete discharge of the capacitor. The discharge current now flows through the light emitting means, causing it to emit light also during this phase of operation. If the discharge current is controlled to be essentially linear the total time during which light of a desired intensity is emitted can approximately be doubled. Switches S1 and S2 need of course be controlled such that they alternately connect the capacitor to the light emitting means, and cross connection of the charge voltage and the reference potential are to be avoided, although not causing a possible dangerous DC short circuit.

By optimizing the waveform of the saw tooth signal present at transistor P4, the current flow duty cycle can be increased. A trade-off between capacitor size, clock rate, and the amplitude of the clock signals will influence the dynamic dissipation.

The over voltage diode D1 is in fact useful. This simulation proves that no 5V transistors are required. In terms of active devices, a standard logic process like 0.18 u 1.8V/3.3V could for example be used, making manufacturing of this circuit easy and inexpensive. It is also conceivable to use only 3.3V devices, further reducing complexity of the production process.

The invention claimed is:
1. A circuit including:
a light emitting element,
a transistor for current control,
a first capacitor,
a first switching transistor arranged in a series-connection with the light emitting element, the transistor for current control, and the first capacitor, wherein the series-connection is connected between a first voltage and a second voltage, and the first switching transistor is controllable to conduct or interrupt a current in a first or a second operating phase, respectively,
a second switching transistor,
a second capacitor being connected to a control terminal of the transistor for current control, for storing a control voltage applied thereto to the control terminal of the transistor for current control via a control line and the second switching transistor during a programming phase, wherein a current charging the first capacitor during the first operating phase is passed through the light emitting element and wherein the transistor for current control is a source follower transistor, thereby charging the first capacitor with a difference voltage between the control voltage applied to the second capacitor in the programming phase and a gate-source threshold voltage of the transistor for current control, and a third switching transistor being connected to the first capacitor for discharging the first capacitor in the second operating phase.

2. The circuit of claim 1, wherein the control voltage applied to the control terminal of the transistor for current control is continuously increasing or decreasing, for providing an essentially constant current through the series-connection.

3. An active matrix display comprising a plurality of circuits according to claim 1.

4. A circuit including:
a light emitting element,
a transistor for current control transistor,
a first switching transistor,
a second switching transistor arranged in a series-connection with the light emitting element, the transistor for current control, and the first switching transistor, wherein the first switching transistor is controllable to conduct or interrupt a current in a first or a second operating phase, respectively, wherein the second switching transistor is controllable to conduct or interrupt a current in the second or the first operating phase, respectively, and wherein the series-connection is connected between a first voltage and a second voltage,
a first capacitor having a first terminal connected to the series-connection between the first and the second switching transistors, a second terminal of the first capacitor being connected to a third voltage, wherein the first capacitor is charged in the first operating phase, and discharged in the second operating phase,
a second capacitor being connected to a control terminal of the transistor for current control, for storing a control voltage applied thereto to the control terminal of the transistor for current control via a control line and a third switching transistor during a programming phase, and the third switching transistor,
wherein the transistor for current control is a source follower transistor, thereby charging the first capacitor with a difference voltage between the control voltage applied to the second capacitor in the programming phase and a gate-source threshold voltage of the transistor for current control.

5. An active matrix display comprising a plurality of circuits according to claim 4.

6. A circuit including:
a light emitting element,
a transistor for current control,
a first capacitor arranged in a series-connection with the light emitting element and the transistor for current control, wherein the series-connection is connected between a first voltage and a second voltage,
a second capacitor having a first electrode connected to a control terminal of the transistor for current control, wherein the second capacitor stores a first control voltage applied to the control terminal of the transistor for current control via a control line and a first switching transistor during a programming phase, wherein a current charging the first capacitor during a first operating phase is passed through the light emitting element, and wherein the transistor for current control is a source follower transistor, thereby charging the first capacitor with a difference voltage between the first control voltage applied to the second capacitor in the programming phase and a gate-source threshold voltage of the transistor for current control, and
a second switching transistor being connected to the first capacitor for discharging the first capacitor in a second operating phase, wherein, in the second operating phase, a second control voltage that interrupts a current flow through the transistor for current control is provided to the control terminal of the transistor for current control by accordingly changing a potential of a second electrode of the second capacitor.

7. An active matrix display comprising a plurality of circuits according to claim 6.

* * * * *